United States Patent
Park et al.

(10) Patent No.: US 7,196,010 B2
(45) Date of Patent: Mar. 27, 2007

(54) SLURRY FOR CHEMICAL MECHANICAL POLISHING PROCESS AND METHOD OF MANUFACTURING SEMICONDUCTOR DEVICE USING THE SAME

(75) Inventors: Young-rae Park, Suwon (KR); Jung-yup Kim, Seoul (KR); Bo-un Yoon, Seoul (KR); Kwang-bok Kim, Kyungki-do (KR); Jae-phil Boo, Suwon (KR); Jong-won Lee, Sungnam (KR); Sang-rok Hah, Seoul (KR); Kyung-hyun Kim, Seoul (KR); Chang-ki Hong, Suwon (KR)

(73) Assignee: Samsung Electronics, Co., Ltd. (KR)

( * ) Notice: Subject to any disclaimer, the term of this patent is extended or adjusted under 35 U.S.C. 154(b) by 215 days.

(21) Appl. No.: 10/639,541

(22) Filed: Aug. 12, 2003

(65) Prior Publication Data

US 2004/0033693 A1    Feb. 19, 2004

Related U.S. Application Data

(62) Division of application No. 09/861,697, filed on May 21, 2001, now Pat. No. 6,626,968.

(30) Foreign Application Priority Data

May 22, 2000    (KR) ............................... 2000-27503

(51) Int. Cl.
*H01L 21/302* (2006.01)

(52) U.S. Cl. ........................................ 438/692; 51/307

(58) Field of Classification Search ........ 438/689–693; 252/79.1–79.5; 51/307–309
See application file for complete search history.

(56) References Cited

U.S. PATENT DOCUMENTS

| | | | |
|---|---|---|---|
| 4,051,056 A | 9/1977 | Hartman | 252/99 |
| 4,968,381 A | 11/1990 | Prigge et al. | 156/636 |
| 5,073,285 A | 12/1991 | Liberati et al. | 252/94 |
| 5,264,010 A | 11/1993 | Brancaleoni et al. | 51/308 |
| 5,352,277 A | 10/1994 | Sasaki | 106/6 |
| 5,759,917 A | 6/1998 | Grover et al. | 438/690 |
| 5,769,689 A | 6/1998 | Cossaboon et al. | 451/41 |
| 5,814,113 A | 9/1998 | Neuland | 51/298 |
| 5,876,490 A * | 3/1999 | Ronay | 106/3 |
| 5,916,855 A | 6/1999 | Avanzino et al. | 51/307 |
| 6,149,830 A * | 11/2000 | Lin et al. | 216/89 |
| 6,258,140 B1 * | 7/2001 | Shemo et al. | 51/308 |
| 6,303,506 B1 * | 10/2001 | Nojo et al. | 438/692 |
| 6,492,283 B2 * | 12/2002 | Raaijmakers et al. | 438/770 |
| 6,503,418 B2 * | 1/2003 | Sahota et al. | 252/79.1 |
| 6,607,404 B1 * | 8/2003 | Ito et al. | 439/630 |
| 6,679,928 B2 * | 1/2004 | Costas et al. | 51/307 |
| 6,720,264 B2 * | 4/2004 | Sahota et al. | 438/692 |
| 6,833,084 B2 * | 12/2004 | Mercaldi et al. | 252/79.1 |
| 2003/0073311 A1 * | 4/2003 | Levert et al. | 438/689 |
| 2004/0060472 A1 * | 4/2004 | Ronay | 106/3 |

FOREIGN PATENT DOCUMENTS

| | | |
|---|---|---|
| EP | 1020501 | 7/2000 |
| WO | WO 00/00560 | 1/2000 |

* cited by examiner

*Primary Examiner*—Kin-Chan Chen
(74) *Attorney, Agent, or Firm*—Mills & Onello LLP

(57) ABSTRACT

A slurry composition useful for chemical mechanical polishing of the surface of a material layer, e.g., a silicon oxide layer, is disclosed. A first material surface which is exposed to the slurry exhibits hydrophilicity, while a second material layer, e.g., a polysilicon layer, the surface of which is also exposed to the slurry, exhibits hydrophobicity, and accordingly acts as a polishing stopping layer. The slurry composition consists essentially of water, abrasive grains, and a polymer additive having both hydrophilic and hydrophobic functional groups.

34 Claims, 5 Drawing Sheets

SLURRY FOR CHEMICAL MECHANICAL POLISHING PROCESS AND METHOD OF MANUFACTURING SEMICONDUCTOR DEVICE USING THE SAME

RELATED APPLICATIONS

This application is a divisional of U.S. application Ser. No. 09/861,697, filed on May 21, 2001 now U.S. Pat. No. 6,626,968, the contents of which are incorporated herein in their entirety by reference.

BACKGROUND OF THE INVENTION

1. Field of the Invention

The present invention relates to a slurry composition for a chemical mechanical polishing process and a method of manufacturing a semiconductor device using the same, and, more particularly, to a slurry for a chemical mechanical polishing (hereinafter referred to as "CMP") process that results in a high selectivity ratio to polysilicon and to a method of planarizing the surface of a semiconductor device using the same.

2. Description of the Related Art

The high performance and high integration requirements of modern semiconductor devices demand a multilayer interconnection structure. This multilayer interconnection structure is typically made by performing the sequential steps of film forming/layer deposition followed by an etch process of conductive layers and insulating layers, and repeating these steps several times. Predetermined patterns required for each layer are formed, and then a surface planarization step is performed so that a lithographic process may be easily performed before another pattern is formed.

This planarization step is classified into local planarization and global planarization. The ultimate object of planarization technology is to realize global planarization. Techniques for this global planarization typically include the steps of forming a coating of resin, such as polyimide, followed by an etch-back step, a reflow, and a CMP for the metallic and insulating layers.

A wafer on which a planarization process will be performed is mounted on a rotatory plate, and the surface of the wafer is made to contact a polishing pad. After this, CMP is carried out by rotating the rotatory plate and the polishing pad while providing a supply of slurry between the wafer surface and the polishing pad. In other words, a CMP process is a combination of a chemical action of a slurry, comprising a chemical solution and abrasive grains, and the mechanical action of a polisher. The slurry is supplied between the wafer surface and the polishing pad, and mechanical friction is generated due to the abrasive grains in the slurry and the surface of the pad. As a result of the mechanical effects, the wafer surface is polished. At the same time, part of the wafer surface is removed by the chemical reaction of the chemical components in the slurry with at least portions of the wafer surface.

In general, various kinds of CMP slurries are used depending on the characteristics of the wafer surface materials to be removed. In particular, in a case where a polysilicon layer and a silicon oxide layer are being polished by a CMP method employing a silica-based slurry using silica ($SiO_2$) as an abrasive grain, over a given period about twice as much of the polysilicon layer will be removed than the amount of the silicon oxide layer removed. Thus, it can be said that the selectivity ratio of the polysilicon layer to the silicon oxide layer for this CMP process is about 0.5:1. It is therefore difficult or impossible to use a polysilicon layer as a polishing stopping layer when a CMP process is carried out in a specific step of a semiconductor device manufacturing process when using a conventional silica-based slurry. However, for some applications it may be inevitable to carry out such a CMP process despite the problem of the selectivity ratio between a polysilicon layer and a silicon oxide layer in a manufacturing process of a semiconductor device. Alternatively, it may be desirable to use a polysilicon layer as a polishing stopping layer in several steps, not only in a single specific step. Accordingly, it would be desirable to develop a new slurry composition which can be useful in carrying out these types of CMP processes.

OBJECTS OF THE INVENTION

To solve the above problems, it is a general object of the present invention to provide a new slurry composition suitable for a chemical mechanical polishing (CMP) process in which an exposed surface of a material to be polished has the property of hydrophilicity with respect to the slurry.

It is another object of the present invention to provide a method of manufacturing a semiconductor device in which there is a material layer between patterns, and wherein the exposed surface of that material layer has the property of hydrophobicity with respect to the slurry, such that the exposed surface can be globally planarized by a CMP process.

It is still another object of the present invention to provide a method of manufacturing a semiconductor device where global planarization can be carried out with a CMP process using a material layer as a polishing stopping layer wherein the exposed surface of that layer has the property of hydrophobicity with respect to the slurry.

SUMMARY OF THE INVENTION

Accordingly, to achieve the above objects, there is provided a new slurry composition for a chemical mechanical polishing (CMP) process consisting essentially of water, abrasive grains, and a polymer additive having both hydrophilic and hydrophobic functional groups. The slurry is used for polishing a hydrophilic material, the surface of which is exposed to the slurry in a CMP process. The slurry may further comprise a surfactant and a pH control agent containing acid or base. The polymer additive is at least one member selected from the group consisting of poly vinyl methyl ether (PVME), poly ethylene glycol (PEG), poly oxyethylene 23 lauryl ether (POLE), poly propanoic acid (PPA), poly acrylic acid (PAA), and poly ether glycol bis ether (PEGBE).

To achieve the above-described objects, there is provided a method of manufacturing a semiconductor device according to a first embodiment of the present invention. In this first embodiment, a first material layer pattern is formed on a lower layer. The surface of the first material layer is then exposed to the slurry according to the present invention and exhibits hydrophobicity during the CMP process. A second material layer is thereafter formed on the entire resultant structure on which the first material layer pattern was formed. The surface of the second material layer is then exposed to the slurry according to the present invention and exhibits hydrophilicity during the CMP process. A CMP process is performed on the second material layer in order to expose at least a portion of the surface of the first material layer using a slurry comprising water, abrasive grains, and polymer additive having both hydrophilic and hydrophobic functional groups. Preferably, in this embodiment of the invention, the first material layer is formed of polysilicon and the second material layer is formed of silicon oxide.

To further achieve the above-described objects, there is provided a method of manufacturing a semiconductor device according to a second embodiment of the present invention. In this second embodiment, an etch mask pattern including a first material layer is formed on a semiconductor substrate. The surface of the etch mask pattern is then exposed to a slurry according to the present invention and exhibits hydrophobicity during the CMP process. A trench is formed to a predetermined depth. in the semiconductor substrate using the etch mask pattern as a guide. A second material layer having insularity is thereafter formed on the entire resultant structure where the trench was formed. The surface of the second material layer is then exposed to the slurry according to the present invention and exhibits hydrophilicity during the CMP process. A CMP process is performed on the second material layer in order to expose at least a portion of the surface of the first material layer of the etch mask pattern using the slurry comprising water, abrasive grains, and polymer additive having both hydrophilic and hydrophobic functional groups. The remaining first material layer is then removed.

An anti-reflective layer is further formed on the first material layer of the etch mask pattern, and a first oxide layer is formed between the semiconductor substrate and the first material layer of the etch mask pattern. A thermal oxide layer is formed on the exposed surface of the trench after the formation of the-trench. After the remaining first material layer is removed, a sacrificial oxide layer may be formed on the semiconductor substrate.

To further achieve the above-described objects, there is provided a method of manufacturing a semiconductor device according to a third embodiment of the present invention. In this third embodiment, an upper electrode of a capacitor, including a first material layer having conductivity, is formed on an interlayer insulating layer of a semiconductor substrate. The surface of the first material layer is then exposed to a slurry according to the present invention and exhibits hydrophobicity during the CMP process. A second material layer is thereafter formed on the entire resultant structure where the upper electrode was formed. The surface of the second material layer is then exposed to the slurry according to the present invention and exhibits hydrophilicity during the CMP process. A CMP process is performed on the second material layer in order to expose the first material layer using the slurry containing water, abrasive grains, and polymer additive having both hydrophilic and hydrophobic functional groups. A third material layer having insularity is thereafter formed on the entire resultant structure. The surface of the third material layer is exposed to the slurry according to the present invention and exhibits hydrophilicity during the CMP process. A CMP process is performed at least one time on the third material layer in order to expose the surface of the first material layer using the slurry comprising water, abrasive grains, and polymer additive having both hydrophilic and hydrophobic functional groups. The third material layer may be reflowed under heat after forming the third material layer.

According to the present invention, a CMP is performed on a hydrophobic material, a surface of which is exposed to a slurry according to the present invention during a CMP process causing the surface to be polished. The slurry contains a polymer additive having both a hydrophobic functional group and a hydrophilic functional group. A hydrophilic material layer which is deposited on the surface as a polishing stopping layer, is also exposed to the slurry during a CMP process. Polymer is selectively adsorbed only on the surface of the hydrophobic material layer. As a result, a passivation layer is formed to protect the surface of the hydrophobic material layer from being etched. Meanwhile, the hydrophilic material deposited on the surface to be polished does not react with polymer. Thus, it is easy to remove the hydrophilic material from the surface to be polished.

BRIEF DESCRIPTION OF THE DRAWINGS

The above objectives and advantages of the present-invention will become more apparent by describing in detail preferred embodiments thereof with reference to the attached drawings in which.

DESCRIPTION OF THE PREFERRED EMBODIMENTS

Figure 1:
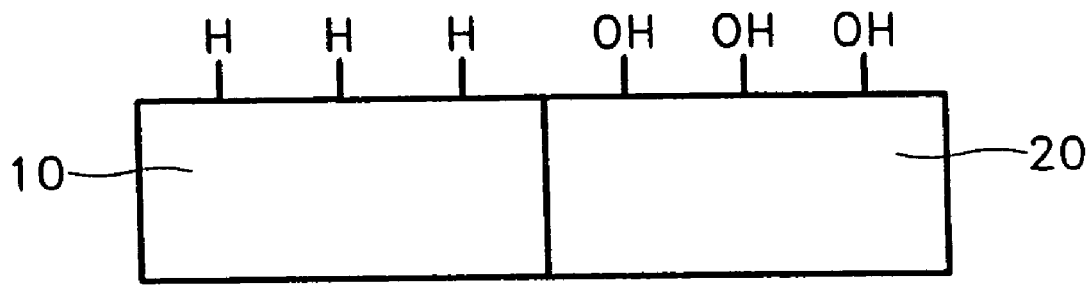
FIG. 1 is a drawing for explaining the properties of hydrophobicity and hydrophilicity of a surface exposed to a slurry in a chemical mechanical polishing (CMP) process according to an embodiment of the present invention.

Hereinafter embodiments of the present invention will be described in detail with reference to the attached drawings. However, it will be understood that the embodiments of the present invention can be modified into various other forms, and the scope of the present invention should not be interpreted as being restricted to the specifically described embodiments. The several specific embodiments described herein are provided to more completely explain the present invention to those skilled in the art. In the drawings, the thicknesses of layers or regions are exaggerated for clarity, and like reference numerals denote the same members in different drawings. Also, when it is written that a layer is formed "on" another layer or a substrate, it is meant that the layer can be formed directly on the other layer or the substrate, or alternatively other layers can intervene therebetween.

The semiconductor device manufacturing process of the present invention includes chemical mechanical polishing (CMP), which is a planarization technology. CMP is a technique for globally and uniformly planarizing a wafer surface containing heterogeneous substances. In planarizing the wafer surface by CMP, a uniformly flat surface can be achieved in the global planarization process. In this case, not only are material removal rates irregular, depending on substances, but also a multilayer structure of a semiconductor device is thin film and thus it is difficult or impossible to control the material removal rates accurately. In accordance with the present invention, improved global planarization can be accomplished by utilizing the exposed surface of a polishing stopping layer wherein the polishing layer has a lower material removal rate than the material to be polished during planarization.

Thus, the CMP process according to the present invention is performed using one material, the surface of which is exposed to a slurry in a CMP process and which exhibits hydrophilicity, as a material to be polished, and using another material, the surface of which is exposed to a slurry in a CMP process and which exhibits hydrophobicity, as a polishing stopping layer. Hereinafter, the slurry applied to the CMP process and the steps of manufacturing a semiconductor device using the same will be described in detail.

1. Improved Slurry Composition

A slurry useful for carrying out a CMP process is a liquid composition which generally contains water and abrasive grains. In this embodiment, a commonly used slurry (model name SS25 developed by American Cabot Corporation) for polishing an oxide layer is used. Here, the liquid is deionized water and the abrasive grains are silica-based abrasive grains. However, other common abrasive grains, such as alumina ($Al_2O_3$), ceria ($CeO_2$), and magania ($Mn_2O_3$), may also be used. The size and amount of the abrasive grains dispersed in the slurry have a large effect on polishing efficiency. Thus, in this embodiment, the amount of the abrasive grains is preferably about 25% by weight or less, for example about 1 to 25% by weight. For example, silica ($SiO_2$) is preferably used within the range of about 5 to 12.5% by weight, and ceria is preferably used within the range of about 1 to 10% by weight.

A surfactant for activating the interface between the slurry and the material to be polished, and/or an agent for controlling the pH of the slurry may also be added to the slurry. In other words, a base such as potassium hydroxide (KOH) or an acid such as sulfuric acid ($H_2SO_4$), nitric acid ($HNO_3$), hydrochloric acid (HCl), or phosphoric acid ($H_3PO_4$) may be added in small, controlled amounts to the slurry sufficient to adjust the slurry pH to within the range of about 7 to 11.

Meanwhile, one or a mixture of polymers having both a hydrophilic functional group and a hydrophobic functional group is further added to the slurry composition of the present invention. Polar materials containing oxygen, nitrogen, and sulfur, such as an —OH group, a —COOH group, an —$NH_2$ group, or an —$SO_3H$ group, are hydrophilic. On the other hand, hydrocarbons of an aliphatic group and an aromatic group not including these polar functional groups are hydrophobic. The added polymer having a hydrophilic functional group and a hydrophobic functional group may include poly vinyl methyl ether (PVME), poly ethylene glycol (PEG), poly oxyethylene 23 lauryl ether (POLE), poly propanoic acid (PPA), poly acrylic acid (PM), and poly ether glycol bis ether (PEGBE), and mixtures thereof. Among these polymers, only one may added or two or more may be added. In this embodiment, about 0.001 to 5% by weight of polymer or polymer mixture is added to the slurry.

Figure 2:
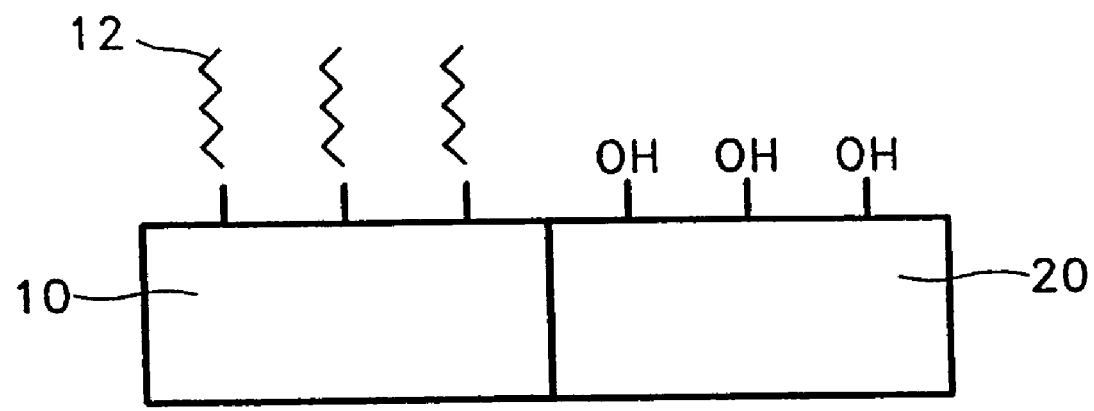
FIG. 2 is a drawing for explaining how a hydrophobic surface exposed to a slurry during a CMP process according to an embodiment of the present invention is protected.

FIG. 1 is a drawing for describing the hydrophilic and hydrophobic surfaces which are exposed to a slurry in a CMP process according to the present invention. FIG. 2 is a drawing for describing the steps of forming a passivation layer on a hydrophobic surface which is to be exposed to a slurry in a CMP process according to the present invention.

Referring to FIG. 1, there are provided a first hydrophobic material layer 10 and, adjacent thereto, a second hydrophilic material layer 20, the surfaces of which are to be exposed to a slurry in a CMP process. In contrast with bulk material, surface oxides or surface pollutants are easily adsorbed on the surfaces of many materials to stabilize their active properties. Thus, in FIG. 1, a portion of the surface layer or the bulk layer is removed from the surfaces of the first and second material layers 10 and 20 by CMP processes. As a result, a material layer identical in composition to the bulk layer and free of surface oxides or surface pollutants is left on the surfaces of the first and second material layers 10 and 20. These surfaces are a newly-formed surfaces which are highly reactive and thus react with the slurry composition with which they are in contact, thereby generating and stabilizing new surfaces.

In a case where a CMP process is performed using a slurry containing water, the newly-formed surface of the first material layer 10 combines with hydrogen ions from the water and then exhibits hydrophobicity. Correspondingly, the newly-formed surface of the second material layer 20 combines with hydroxyl groups from water and then exhibits hydrophilicity. For example, under these conditions, a polysilicon layer 10 would form a hydrophobic surface, whereas a silicon oxide layer 20 would form a hydrophilic surface.

With reference to FIG. 2, in a case where a CMP process is to be performed using a slurry according to the present invention, polymer having both hydrophilic and hydrophobic functional groups is added to the slurry as previously described. Thus, polymer is selectively adsorbed only on the surface of the first material layer 10 having hydrophobicity; and, as a result, a passivation layer 12 is formed thereon. The polymer passivation layer 12 subsequently restrains the chemical reaction of the first material layer 10 with the slurry during a CMP process. As a result, the removal rate of the first material layer 10 during a CMP process drops sharply, while the removal rate of the second material layer 20, which does not react with the added polymer, is maintained. Thus, the selectivity ratio of the first material layer 10 to the second material layer 20 is significantly increased in accordance with the present invention.

Table 1 below shows the results of a CMP process on a silicon oxide layer and a polysilicon layer using a slurry according to the present invention which includes poly vinyl methyl ether (PVME).

TABLE 1

| Amount of PVME added | 0.01% by wt | 0.1% by wt | 1% by wt | 0% by wt |
|---|---|---|---|---|
| Removal Rate of Oxide Layer (Å/min) | 2556 | 2030 | 1926 | 2677 |
| Removal Rate of Polysilicon Layer (Å/min) | 408 | 278 | 248 | 3972 |
| Selectivity Ratio | 6.3 | 7.3 | 7.8 | 0.7 |

As shown in Table 1, in a case where PVME is not added to the slurry, the removal rate of the polysilicon layer during a CMP process is much greater than that of the oxide layer, and thus the selectivity ratio is only 0.7, which is not acceptable. In a case where PVME is added to the slurry, however, the selectivity ratio of the oxide layer to the polysilicon layer is considerably increased to between 6.3 and 7.8 (depending on the amount of PVME added), which yields a highly acceptable result. Also, it is seen that the selectivity ratio increases somewhat with an increase in the addition of PVME from 0.01% by weight to 1% by weight.

Figure 3:
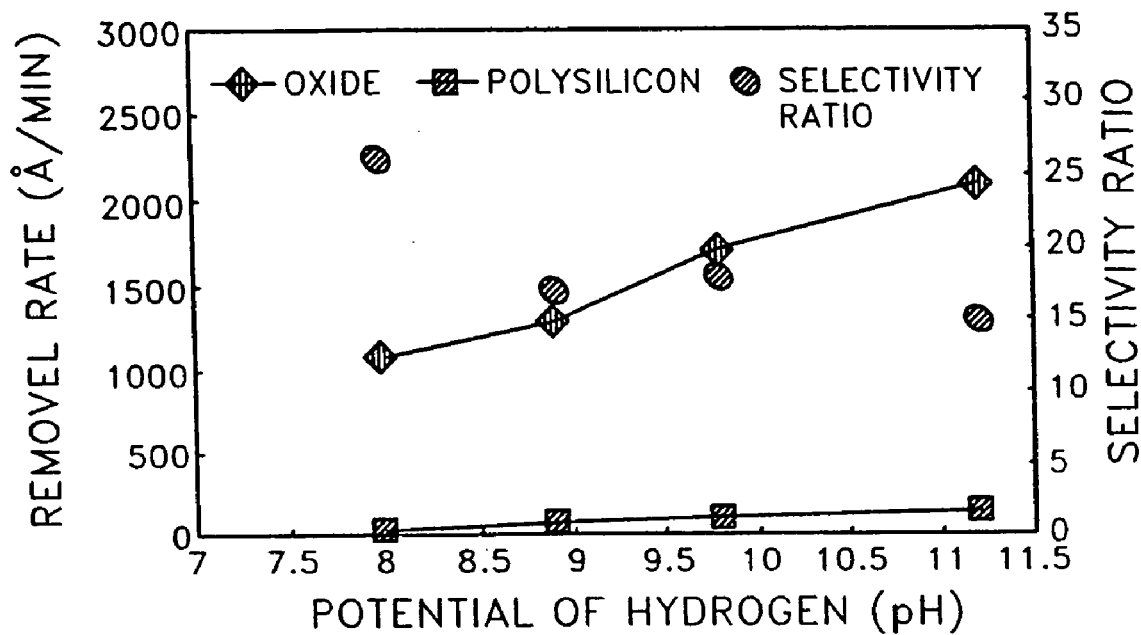
FIG. 3 is a graph illustrating removal rates and selectivity ratios based on a change in hydrogen ion (pH) values of a slurry according to an embodiment of the present invention.

FIG. 3 is a graph for showing how the removal rate and the selectivity ratio of the oxide layer and the polysilicon layer change based on a change in pH by adding sulfuric acid ($H_2SO_4$) to a slurry containing 1% by weight PVME. FIG. 3 shows that the selectivity ratio generally increases along with a decrease in the pH of the slurry. Although the removal rate of polysilicon varies little over pH ranges of about 7.5 to 11.5, FIG. 3 shows that the removal rate of the oxide layer decreases significantly at lower pH values resulting in higher selectivity ratios. When the pH is 8, the selectivity ratio of the polysilicon layer to the oxide layer is 25:1.

Table 2 below shows the results of carrying out a CMP process on a surface comprising adjacent silicon oxide and polysilicon layers using a slurry to which poly ethylene glycol (PEG) has been added.

TABLE 2

| Amount of PEG added | 0.01% by wt | 0.1% by wt | 1% by wt |
|---|---|---|---|
| Removal Rate of Oxide Layer (Å/min) | 2194 | 2336 | 2183 |
| Removal Rate of Polysilicon Layer (Å/min) | 777 | 683 | 580 |
| Selectivity Ratio | 2.8 | 3.4 | 3.8 |

From Table 2, it is seen that the selectivity ratio of the polysilicon layer to the oxide layer increases with an increase in the amount of PEG added to the slurry.

Table 3 below shows the results of carrying out a CMP process on a surface comprising adjacent silicon oxide and polysilicon layers using a slurry to which poly ether glycol bis ether (PEGBE) has been added.

TABLE 3

| Amount of PEGBE added | 0.01% by wt | 0.1% by wt | 1% by wt |
|---|---|---|---|
| Removal Rate of Oxide Layer (Å/min) | 2361 | 2369 | 2389 |
| Removal Rate of Polysilicon Layer (Å/min) | 1477 | 1046 | 776 |
| Selectivity Ratio | 1.6 | 2.3 | 3.1 |

From Table 3, it is seen that the selectivity ratio of the polysilicon layer to the oxide layer increases with an increase in the amount of PEGBE added to the slurry.

Table 4 below shows the results of carrying out a CMP process on a surface comprising adjacent silicon oxide and polysilicon oxide layers using a slurry to which poly oxy-ethylene 23 lauryl ether (POLE) (product name Brij35) has been added.

TABLE 4

| Amount of POLE added | 0.01% by wt | 0.1% by wt | 0.5% by wt |
|---|---|---|---|
| Removal Rate of Oxide Layer (Å/min) | 2621 | 2520 | 2554 |
| Removal Rate of Polysilicon Layer (Å/min) | 662 | 633 | 830 |
| Selectivity Ratio | 4.0 | 4.0 | 4.0 |

From Table 4, it is seen that even a small addition of 0.01% by weight of POLE to the slurry results in a significant increase to 4.0 of the selectivity ratio of the polysilicon layer to the oxide layer and to well above the 0.7 ratio seen with no polymer addition (see Table 1). Further increases in the amount of POLE added to the slurry, however, did not seem to further improve the selectivity ratio.

As described above, compared with a conventional slurry without any added polymer, using the slurry of the present invention (containing polymer having both hydrophobic and hydrophilic functional groups) results in substantially the same removal rate of an oxide layer at the same time that the removal rate of a polysilicon layer is substantially decreased. As a result, the selectivity ratio is greatly improved thereby making it possible to utilize CMP processes in semiconductor manufacturing operations where, in the past, CMP processes were greatly limited.

2. Manufacturing Processes of a Semiconductor Device Using a Slurry of the Present Invention Embodiment 1

Figure 4:
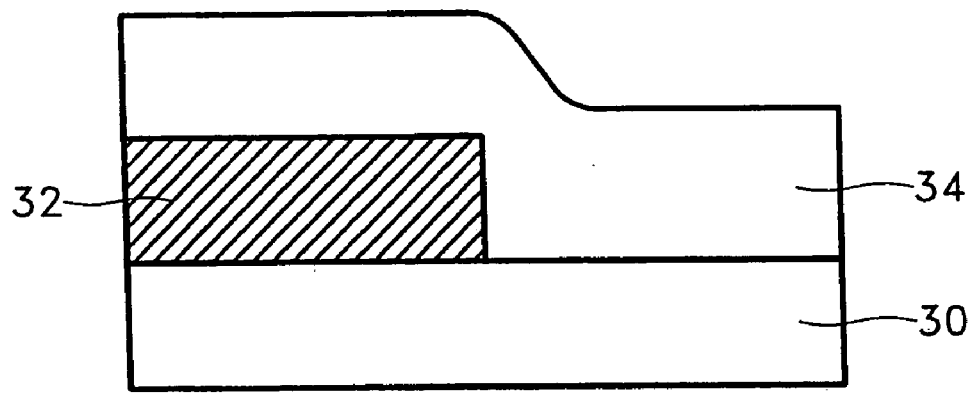
FIGS. 4 and 5 are cross-sectional views for describing the steps of manufacturing a semiconductor device, including at least a CMP step, according to a first embodiment of the present invention.
Figure 5:
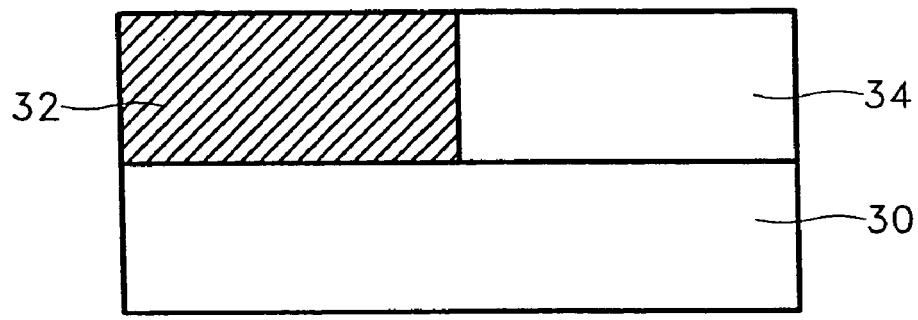

FIGS. 4 and 5 are cross-sectional views for describing semiconductor manufacturing processes which include a CMP process using a polymer-containing slurry according to a first embodiment of the present invention. Referring to FIG. 4, a first material layer pattern 32 is formed on a portion of a lower layer 30. The lower layer 30, which can support the first material layer pattern 32 mechanically, may be a semiconductor substrate, or a specific insulating material layer, or a metallic interconnection layer on a semiconductor substrate. The first material layer pattern 32, made, e.g., of polysilicon, comprises a surface which is to be exposed to a slurry in a CMP process and which exhibits hydrophobicity. The first material layer pattern 32 may be formed by a common photolithographic etching process using photoresist. Also, an anti-reflective layer, such as a silicon oxynitride (SiON) layer, may be further formed on the first material layer pattern 32 before the first material layer pattern 32 is coated with photoresist (not shown).

Meanwhile, a trench may be formed in the lower layer 30 by etching a portion of the lower layer 30 with the formation of the first material layer pattern 32. Also, an intermediate material layer (not shown) may be further formed between the lower layer 30 and the first material layer pattern 32, and then that intermediate material layer may be patterned similar to the first material layer pattern 32.

A second material layer 34 is then formed on the entire resultant structure such that a step difference is made due to the formation of the first material layer pattern 32 on a portion of layer 30. The second material layer 34, made, e.g., of silicon oxide, comprises a surface which is to be exposed to a slurry in a CMP process and which exhibits hydrophilicity. In general, an oxide layer denotes a silicon oxide layer and may include a variety of oxide layers, e.g., a borophosphorous silicate glass (BPSG) layer, an undoped silicate glass (USG) layer, a spin on glass (SOG) layer, a high density plasma (HDP) oxide layer, a plasma enhanced tera-ethyl ortho silicate glass (PETEOS) layer, and a thermal oxide layer. Also, the silicon oxide layer can be formed by a variety of known techniques, e.g., by a thermal oxidation method, by a chemical vapor deposition (CVD) method, or by a physical vapor deposition (PVD) method. It is preferable that the second material layer 34 be thicker than the first material layer pattern 32 in order to overcome the step difference due to the first material layer pattern 32 and to facilitate global planarization. However, in a case where the first material layer pattern 32 is very high, the second material layer 34 may get thicker by stacking the same upon itself several times.

FIG. 5 shows the structure of FIG. 4 in which the surface of the second material layer 34 has been planarized by a CMP process to expose the surface of the first material layer pattern 32 using the previously mentioned slurry according to the present invention. The slurry contains liquid, abrasive grains, and a polymer additive having both hydrophilic and hydrophobic functional groups. During the CMP process, the polymer is selectively adsorbed only on the portion of the surface comprising the first material layer pattern 32 which is exposed to the slurry and which exhibits hydrophobicity due to the hydrophobic functional group of the polymer. As a result, the selectivity ratio of the first material layer pattern 32 to the second material layer 34 is increased. Thus, the surface of the first material layer pattern 32 serves as a CMP stopping layer, which improves the surface uniformity and the results of a subsequent photolithographic process margin carried out after the CMP process is completed.

Embodiment 2

Figure 6:
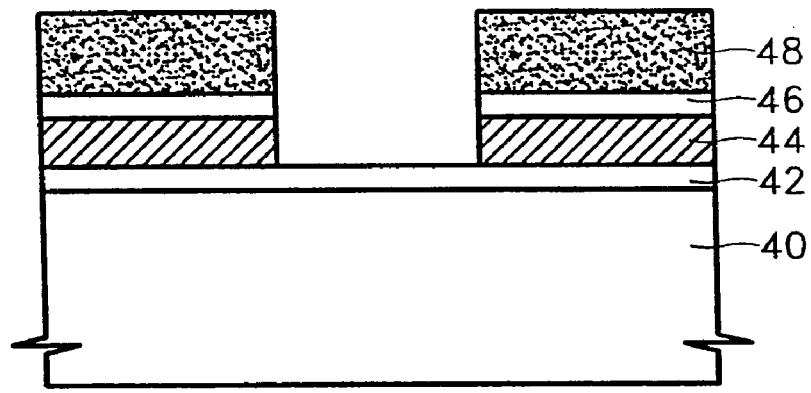
FIGS. 6 through 10 are cross-sectional views for describing the steps of manufacturing a semiconductor device wherein a trench isolation structure is formed by a CMP process according to a second embodiment of the present invention.

FIGS. 6 through 10 show cross-sectional views for describing semiconductor manufacturing processes which include a CMP process and a trench isolation process using a polymer-containing slurry according to a second embodiment of the present invention. Referring to FIG. 6, a first oxide layer 42, a first material layer 44, and an anti-reflective layer 46 are sequentially formed on a semiconductor substrate 40. The first material layer 44, the surface of which is to be exposed to the slurry in a CMP process and which exhibits hydrophobicity, is formed of polysilicon to a thickness of about 1000 to 3000 Å. The anti-reflective layer 46 is formed of silicon oxynitride (SiON). The anti-reflective layer 46 is coated with a photoresist 48, and then a photoresist pattern is formed by a common photolithographic process to delimit a trench area to be formed by a subsequent process. An etch mask pattern is formed by etching the anti-reflective layer 46 and the first material layer 44 in sequence using the photoresist pattern as an etch mask. In this embodiment, the first oxide layer 42 underneath the first material layer 44 may be etched along with the first material layer 44.

Figure 7:
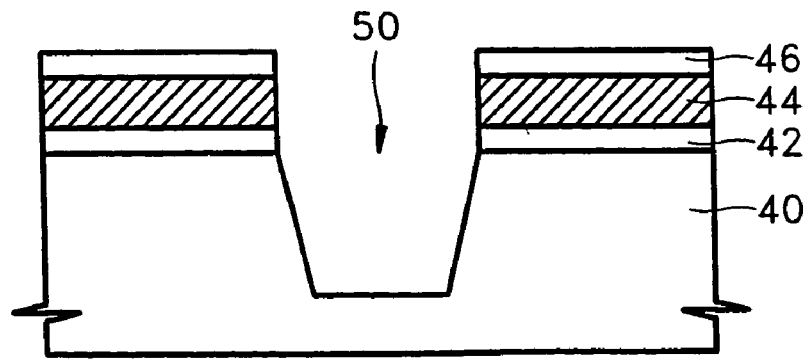

With reference to FIG. 7, the remaining photoresist pattern on the structure shown in FIG. 6 is removed by a common method such as ashing. Next, a trench 50 is formed in the semiconductor substrate 40 to a predetermined depth by etching the first oxide layer 42 and the semiconductor substrate 40 underneath using the anti-reflective layer 46 and the material layer 44 as an etch mask. The trench 50 may be formed, for example, by anisotropic etching using chlorine and hydrogen bromide as etch gases, to a depth appropriate for electrical insulation of adjacent semiconductor devices. Impurity ions (not shown) of the same conductive type as those in the semiconductor substrate 40 may be further implanted into a lower portion of the trench 50 as a channel stopper after the trench 50 is formed.

Figure 8:
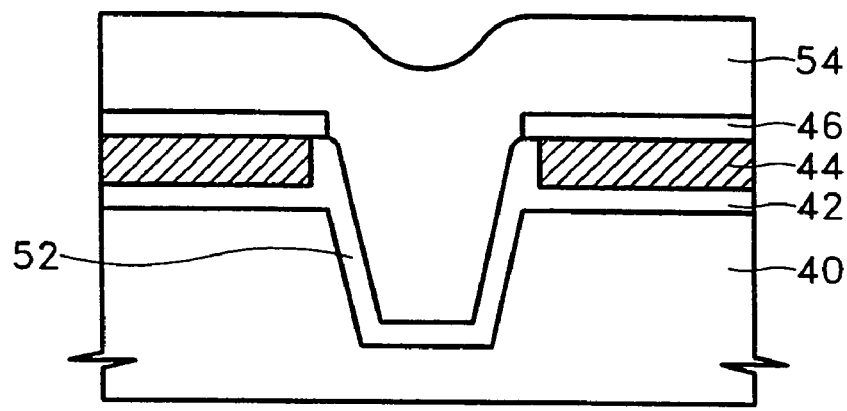

Referring now to FIG. 8, a thermal oxide layer 52 is formed on the bottom face and the sidewalls of the trench 50 as shown in FIG. 7 by heating the semiconductor substrate 40 in which the trench 50 is formed. The thermal oxide layer 52 removes defects generated in the semiconductor substrate 40 during the anisotropic etching for forming the trench 50, prevents current leakage through the surface of the trench 50 by keeping the exposed surface of the semiconductor substrate 40 in a stable bond state ($Si-O_2$ bond), and also prevents the concentration of stress by somewhat rounding the corners of the bottom of the trench. As shown in FIG. 8, the thermal oxide layer 52 is formed along the exposed sidewalls of the first oxide layer 42 and the first material layer 44 made of polysilicon, as well as at the bottom and sidewalls of the trench 50. A second material layer 54 having insularity is formed on the entire resultant structure where the thermal oxide layer 52 is formed resulting in burying the trench 50. The second material layer 54, the surface of which is to be exposed to the slurry in a CMP process and which exhibits hydrophilicity, can be made of silicon oxide such as BPSG, USG, SOG, HDP, PETEOS, or thermal oxide. The silicon oxide layer 54 can be formed by a variety of known techniques, such as a thermal oxidation method, a CVD method, or a PVD method. The second material layer 54 is thicker than the depth of the trench 50 to bury the trench 50 and planarize the surface.

Figure 9:
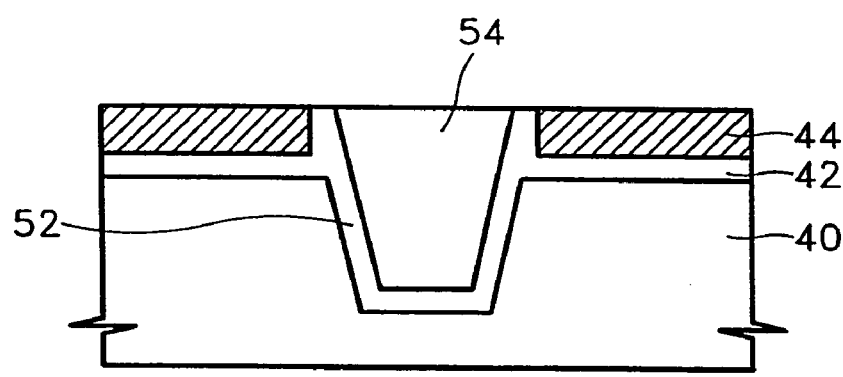

With reference to FIG. 9, the surfaces of the second material layer 54 and the anti-reflective layer 46 as seen in FIG. 8 are now removed and planarized by a CMP process using the previously mentioned slurry of the present invention in order to expose the surface of the first material layer 54 along the top of trench 50. In carrying out the CMP process, polymer additive having both hydrophobic and hydrophilic functional groups is added to the slurry as previously described.

Figure 10:
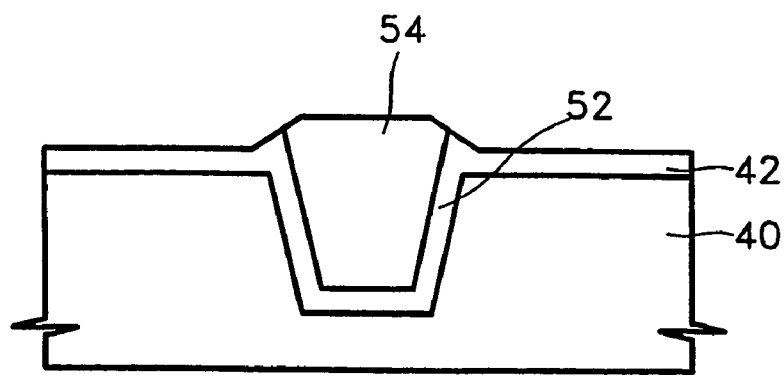

Referring now to FIG. 10, the remaining first material layer pattern 44 as shown in FIG. 9 is removed with a suitable etch solution for removing the first material layer 44. The first oxide layer 42 remaining on the semiconductor substrate 40 is then also removed. Next, the second material layer 54 having insularity is filled in and above the trench 52 and an isolation area, and the surface of the resultant structure is planarized. Meanwhile, a sacrificial oxidation process may be further performed after the first oxide layer 42 is removed. A sacrificial oxide layer is grown to a thickness of about 50 to 200 Å on the exposed semiconductor substrate 40 and then is removed with an oxide agent such as buffered oxide etchant (BOE) and hydrofluoric acid (HF) in a sacrificial oxidation process. This sacrificial process helps to eliminate defects or to repair damage generated on the substrate surface by the previously-mentioned CMP process. Also, after the sacrificial oxide layer is grown, ions for the formation of well, a channel stopper, or the control of threshold voltage may be implanted into the semiconductor substrate 40.

In this embodiment, the slurry used in the CMP process contains liquid, abrasive grains, and polymer additive having both hydrophilic and hydrophobic functional groups. During the CMP process, polymer is adsorbed on the surface of the first material layer 44 which is exposed to the slurry because of the hydrophobic functional group of the polymer. As a result, the selectivity ratio of the first material layer 44 to the second material layer 54 (see FIG. 8) is increased. Thus, the first material layer 44 serves as a CMP stopping layer, which improves the surface uniformity following the CMP process.

Embodiment 3

Figure 11:
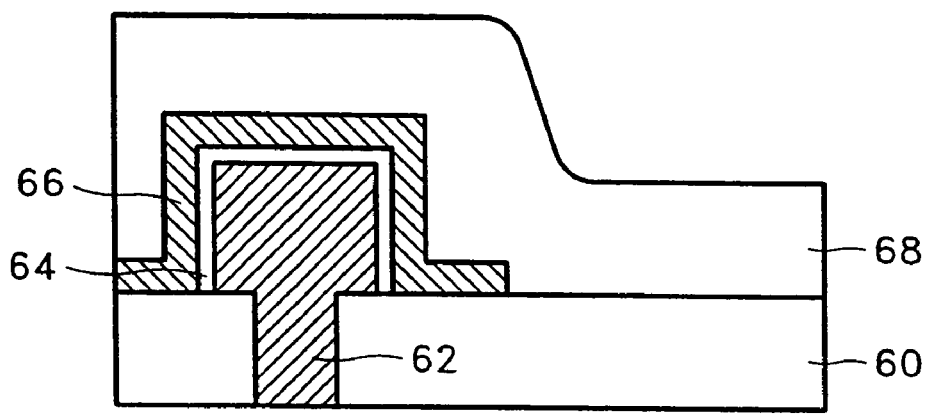
FIGS. 11 through 13 are cross-sectional views for describing the steps of manufacturing a semiconductor device wherein planarization is carried out by a CMP process according to a third embodiment of the present invention.
Figure 12:
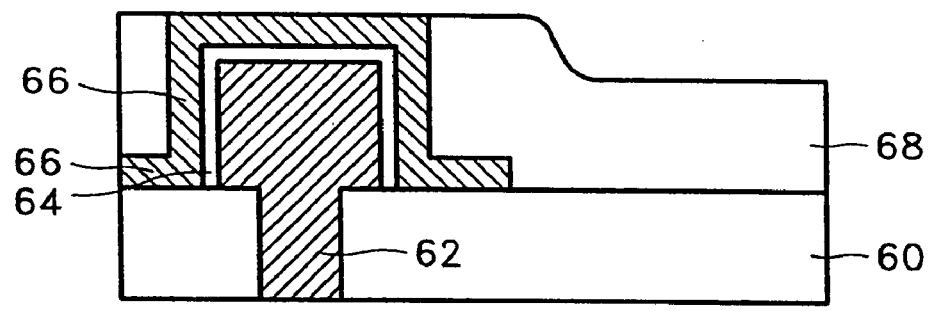
Figure 13:
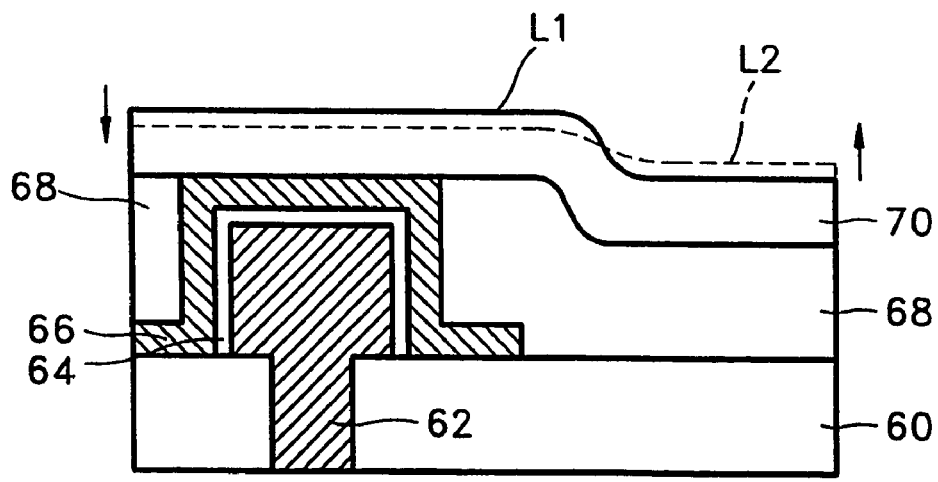

FIGS. 11 through 13 are cross-sectional views for describing semiconductor manufacturing processes which include a planarization process using CMP according to a third embodiment of the present invention.

FIG. 11 shows a capacitor formed on a semiconductor substrate. The manufacturing process thereof is as follows. A contact hole is formed in a interlayer insulating layer 60 on a semiconductor substrate (not shown). Next, a lower electrode 62 is formed by depositing on the entire semiconductor substrate and patterning a material for a lower electrode of the capacitor. Next, a dielectric layer 64 is formed on the exposed surface of the lower electrode 62. An upper electrode 66 is then formed by depositing and patterning a first material layer for an upper electrode of the capacitor on the entire semiconductor substrate. The upper electrode 66, the surface of which is to be exposed to the slurry in a CMP process and which exhibits hydrophobicity, is made of a conductive material, e.g., polysilicon. A second material layer 68 having insularity is then formed on the entire resultant structure to reduce the surface step difference between a memory cell area where the upper electrode 66 is formed (left portion of FIG. 11) and a peripheral area where a pattern such as the upper electrode 66 is not formed (right portion of FIG. 11). The second material layer 68, the surface of which is to be exposed to the slurry in a CMP process and which exhibits hydrophilicity, is made of BPSG. However, the second material layer 68 may alternatively be made of any of the members of the group consisting of PSG, PETEOS, and USG instead of BPSG. It is preferable that the second material layer 68 have a reflow property which is advantageous to a surface planarization. Preferably, the second material layer 68 is deposited to a depth that is thicker than the height from the surface of the interlayer insulating layer 60 to the top surface of upper electrode 66 in order to overcome the step difference made by the upper electrode pattern 66 and to facilitate planarizing the surface. However, in a case where the upper electrode 66 is very high, the second material layer 68 can be made thicker by stacking the same upon itself several times.

Referring to FIG. 12, a CMP process is now performed on the structure shown in FIG. 11 using the previously mentioned slurry of the present invention to planarize the second material layer 68 so that the upper surface of the upper electrode 66 is exposed. In a case where CMP is performed using a slurry containing dispersed silica-based abrasive grains to which 1% by weight of PVME is added, the removal rate of a polysilicon layer (e.g., electrode 66) is about 210 Å/min, while the removal rate of an unannealed BPSG layer is about 8786 Å/min. For comparison, the removal rate of an annealed BPSG layer is about 5374 Å/min, and the removal rate of a PETEOS layer is about 1250 Å/min. Thus, the selectivity ratios of these three material layers which may comprise layer 68 relative to the polysilicon layer 66 are respectively 42:1, 27:1, and 6:1. Alternatively, in a case where the polysilicon layer 66 is annealed, the removal rate thereof increases to about 480 Å/min, thereby reducing the selectivity ratio considerably. Thus, it is preferable that a reflow process requiring a heat treatment not be performed for the second material layer 68 prior to carrying out the CMP process.

The CMP process is preferably performed at a low pressure, e.g., at a pressure of about 2 to 5 psi to minimize possible damage to the edges of the upper electrode 66.

With reference now to FIG. 13, a third material layer 70 having insularity is formed on the entire resultant structure after it has been planarized to expose the surface of the upper electrode 66 as shown in FIG. 12. In a case where the upper surface of the upper electrode 66 is not fully planarized by only one CMP process due to the very high height thereof, the CMP process can be repeated several times using the slurry of the present invention so that the upper surface of the upper electrode 66 will be exposed after the third material layer 70 is formed. It is preferable that the third material layer 70 be comprised of a dielectric material, the surface of which is to be exposed to the slurry and which exhibits hydrophilicity, and more preferably, that layer 70 be comprised of the same material as the second material layer 68. Then, a reflow process is performed at a temperature of about 850° C. The reflow process is a global planarization technique which utilizes the mobility of a heated material layer to help effect planarization. The initial surface (labeled "L1" in FIG. 13) of the third material layer 70 is globally planarized to some extent by carrying out a reflow process resulting in a more planarized surface (labeled "L2" in FIG. 13) for layer 70.

The slurry used in this embodiment also contains polymer additive having both hydrophilic and hydrophobic functional groups in accordance with the present invention. Thus, during a CMP process, polymer is adsorbed on the surface of the upper electrode 66 which is to be exposed to the slurry and which exhibits hydrophobicity due to the hydrophobic functional group of the polymer. As a result, the selectivity ratio of the upper electrode 66 relative to the second material layer 68 is increased. Accordingly, the upper electrode 66 serves as a CMP stopping layer, which improves the surface uniformity following the CMP process and facilitates a subsequent photolithographic etch process margin.

As described above, according to the present invention, polymer having both hydrophilic and hydrophobic functional groups is added to a CMP slurry. Thus, the polymer is adsorbed on a material layer, the surface of which is to be exposed to the slurry and which exhibits hydrophobicity. Since the material layer serves as a CMP passivation layer, it is useful as a CMP stopping layer. Also, in a case where the slurry of the present invention is used for carrying out a CMP process on a material layer having a hydrophobic surface, the selectivity ratio is greatly improved and as a result, it is easier to planarize the surface.

It will be apparent to those skilled in the art that other changes and modifications may be made in the above-described CMP methods and slurry compositions without departing from the scope of the invention herein, and it is intended that all matter contained in the above description shall be interpreted in an illustrative and not a limiting sense.

What is claimed is:

1. In a method of manufacturing a semiconductor device that includes a step of planarizing a wafer surface containing heterogeneous substances using a CMP process with a slurry composition, the improvement comprising the sequential steps of:

a forming a first material layer pattern on a first surface portion of a semiconductor lower layer, said lower layer comprising adjacent first and second surface portions, said first material layer consisting of a first material which exhibits the property of hydrophobicity with respect to the slurry composition along a surface of said first material;

(b) forming a second material layer pattern on said surface of said first material and also on said second surface portion of said semiconductor lower layers, said second material layer consisting of a second material that is different from the first material and which exhibits the property of hydrophilicity with respect to the slurry composition along a surface of said second material; and, (c) planarizing the surface of the resultant structure to expose adjacent planarized surfaces of the first and second materials by a chemical mechanical polishing (CMP) process using a slurry composition consisting essentially of water, abrasive grains-selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof.

2. A method according to claim 1, wherein said first material layer is made of polysilicon and said second material layer is made of silicon oxide.

3. A method according to claim 2, wherein the pH of the slurry composition is adjusted to within the range of about 7 to 11.

4. A method according to claim 2 wherein the selectivity ratio of the slurry composition for removal of the silicon oxide layer relative to removal of the polysilicon layer is a minimum of 1.6.

5. A method according to claim 1 wherein the concentration of polymer additive ranges from 0.01% to 1% by weight.

6. In a method of manufacturing a semiconductor device that includes a step of planarizing a wafer surface containing heterogeneous substances using a CMP process with a slurry composition, the improvement comprising the sequential steps of:
 (a) forming on a first portion of a semiconductor substrate that comprises adjacent first and second substrate portions an etch mask pattern by depositing on said first substrate portion at least a first material layer of a first material which exhibits the property of hydrophobicity with respect to the slurry composition along a surface of said first material;
 (b) forming a trench in the first portion of the semiconductor substrate to a predetermined depth using said etch mask pattern to guide the trench formation;
 (c) forming a second material layer of a second material on the structure where said trench has been formed, said second material having the properties of insularity and exhibiting hydrophilicity with respect to the slurry composition along a surface of said second material; and,
 (d) planarizing the surface of the resultant structure to expose adjacent planarized surfaces of the first and second materials by a chemical mechanical polishing (CMP) process using a slurry composition consisting essentially of water, abrasive grains selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof.

7. A method according to claim 6, wherein the etch mask pattern comprises a stack layer consisting of said first material layer and an anti-reflective layer.

8. A method according to claim 7, wherein said anti-reflective layer is made of silicon oxynitride (SiON).

9. A method according to claim 6, further comprising the step of forming a first oxide layer between the semiconductor substrate and the first material layer of the etch mask pattern before carrying out step (a).

10. A method according to claim 6, further comprising the step of forming a thermal oxide layer on the exposed surface of the trench after carrying out step (b) and before carrying our step (c).

11. A method according to claim 6, further comprising the step of removing the remaining first material layer after completing step (d).

12. A method according to claim 11, further comprising the step of forming a sacrificial oxide layer on the semiconductor substrate after the step of removing the first material layer.

13. A method according to claim 6, wherein said first material layer is made of polysilicon and said second material layer is made of silicon oxide.

14. A method according to claim 13 wherein the selectivity ratio of the slurry composition for removal of the silicon oxide layer relative to removal of the polysilicon layer is a minimum of 1.6.

15. A method according to claim 6, further wherein a pH control agent containing acid or base is added to the slurry composition to adjust the pH of the slurry composition to within the range of about 7 to 11.

16. A method according to claim 6 wherein the concentration of polymer additive ranges from 0.01% to 1% by weight.

17. In a method of manufacturing a semiconductor device that includes a step of planarizing a wafer surface containing heterogeneous substances using a CMP process with a slurry composition, the improvement comprising the sequential steps of:
 (a) forming an interlayer insulating layer on a first portion of a semiconductor substrate that comprises adjacent first and second substrate portions;
 (b) forming on said interlayer insulating layer an upper electrode of a capacitor by depositing on said insulating layer at least a first material layer of a first material having the properties of conductivity and exhibiting hydrophobicity with respect to the slurry composition along a surface of said first material;
 (c) forming on said surface of said first material and also on the adjacent second substrate portion a second material layer of a second material which exhibits the property of hydrophilicity with respect to the slurry composition along a surface of said second material;
 (d) planarizing the surface of the resultant structure to expose adjacent planarized surfaces of the first and second materials by a chemical mechanical polishing (CMP) process using a slurry composition consisting essentially of water, abrasive grains selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof; and,
 (e) forming on the resultant structure a third material layer of a third material having the property of insularity.

18. A method according to claim 17, wherein said third material exhibits the property of hydrophilicity with respect to the slurry composition along a surface of said third material.

19. A method according to claim 18, further comprising the step of performing a CMP process at least one time on said surface of said third material in order to expose said surface of said first material using said slurry composition.

20. A method according to claim 17, further comprising the step of reflowing the third material layer under heat after forming said third material layer.

21. A method according to claim 17, wherein said first material layer is made of polysilicon and said second material layer is made of silicon oxide.

22. A method according to claim 21 wherein the selectivity ratio of the slurry composition for removal of the silicon oxide layer relative to removal of the polysilicon layer is a minimum of 1.6.

23. A method according to claim 17 wherein the concentration of polymer additive ranges from 0.01% to 1% by weight.

24. In a method of manufacturing a semiconductor device that includes a step of planarizing a wafer surface containing heterogeneous substances using a CMP process with a slurry composition, the improvement comprising the sequential steps of:
  (a) forming a first material layer pattern on a first surface portion of a semiconductor lower layer, said lower layer comprising adjacent first and second surface portions, said first material layer consisting of a first material which exhibits the property of hydrophobicity with respect to the slurry composition along a surface of said first material;
  (b) forming a second material layer pattern on said surface of said first material and also on said second surface portion of said semiconductor lower layer, said second material layer consisting of a second material that is different from the first material and which exhibits the property of hydrophilicity with respect to the slurry composition along a surface of said second material; and,
  (c) planarizing the surface of the resultant structure to expose adjacent planarized surfaces of the first and second materials by a chemical mechanical polishing (CMP) process using a slurry composition consisting essentially of water, abrasive grains-selected from the group consisting of silica ($SiO_2$), alumina ($Al_2O_3$), ceria ($CeO_2$), magania ($Mn_2O_3$), and mixtures thereof, a surfactant, a pH control agent containing acid or base, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof.

25. A method according to claim 24, wherein said first material layer is made of polysilicon and said second material layer is made of silicon oxide.

26. A method according to claim 25, wherein the pH of the slurry composition is adjusted to within the range of about 7 to 11.

27. In a method of manufacturing a semiconductor device that includes a step of planarizing a wafer surface containing heterogeneous substances using a CMP process with a slurry composition, the improvement comprising the sequential steps of:
  (a) forming an interlayer insulating layer on a first portion of a semiconductor substrate that comprises adjacent first and second substrate portions;
  (b) forming on said interlayer insulating layer an upper electrode of a capacitor by depositing on said insulating layer at least a first material layer of a first material having the properties of conductivity and exhibiting hydrophobicity with respect to the slurry composition along a surface of said first material;
  (c) forming on said surface of said first material and also on the adjacent second substrate portion a second material layer of a second material which exhibits the property of hydrophilicity with respect to the slurry composition along a surface of said second material;
  (d) planarizing the surface of the resultant structure to expose adjacent planarized surfaces of the fist and second materials by a chemical mechanical polishing (CMP) process using a slurry composition consisting essentially of water, abrasive grains selected from the group consisting of silica ($SiO_2$), alumina ($Al_2O_3$), ceria ($CeO_2$), magania ($Mn_2O_3$), and mixtures thereof, a pH control agent containing acid or base, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof; and,
  (e) forming on the resultant structure a third material layer of a third material having the property of insularity.

28. A method according to claim 27 wherein the pH control agent is added to the slurry composition to adjust the pH of the slurry composition to within the range of about 7 to 11.

29. A method according to claim 27, wherein said third material exhibits the property of hydrophilicity with respect to the slurry composition along a surface of said third material.

30. A method according to claim 29, further comprising the step of performing a CMP process at least one time on said surface of said third material in order to expose said surface of said first material using said slurry composition.

31. A method according to claim 27, further comprising the step of reflowing the third material layer under heat after forming said third material layer.

32. A method according to claim 27, wherein said first material layer is made of polysilicon and said second material layer is made of silicon oxide.

33. In a method of manufacturing a semiconductor device that includes a step of planarizing a wafer surface containing heterogeneous substances using a CMP process with a slurry composition, the improvement comprising the sequential steps of:
  (a) forming a first material layer pattern on a first surface portion of a semiconductor lower layer, said lower layer comprising adjacent first and second surface portions, said first material layer consisting of a first material which exhibits the property of hydrophobicity with respect to the slurry composition along a surface of said first material;
  (b) forming a second material layer pattern on said surface of said first material and also on said second surface portion of said semiconductor lower layer, said second material layer consisting of a second material that is different from the first material and which exhibits the property of hydrophilicity with respect to the slurry composition along a surface of said second material; and,
  (c) planarizing the surface of the resultant structure to expose adjacent planarized surfaces of the first and second materials by a chemical mechanical polishing (CMP) process using a slurry composition comprising water, abrasive grains-selected from the group consisting of silica ($SiO_2$), alumina ($Al_2O_3$), ceria ($CeO_2$), magania ($Mn_2O_3$), and mixtures thereof, a surfactant, a pH control agent containing acid or base, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poiy acrylic acid (PAA), poly ether glycol bis ether (PEGBE), and mixtures thereof.

34. In a method of manufacturing a semiconductor device that includes a step of planarizing a wafer surface containing heterogeneous substances using a CMP process with a slurry composition, the improvement comprising the sequential steps of:
- a forming a first material layer pattern on a first surface portion of a semiconductor lower layer, said lower layer comprising adjacent first and second surface portions, said first material layer consisting of a first material which exhibits the property of hydrophobicity with respect to the slurry composition along a surface of said first material;
- (b) forming a second material layer pattern on said surface of said first material and also on said second surface portion of said semiconductor lower layer, said second material layer consisting of a second material that is different from the first material and which exhibits the property of hydrophilicity with respect to the slurry composition along a surface of said second material; and,
- (c) planarizing the surface of the resultant structure to expose adjacent planarized surfaces of the first and second materials by a chemical mechanical polishing (CMP) process using a slurry composition including water, abrasive grains-selected from the group consisting of silica ($SiO_2$), alumina ($Al_2O_3$), ceria ($CeO_2$), magania ($Mn_2O_3$), and mixtures thereof, a surfactant, a pH control agent containing acid or base, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof.

* * * * *

UNITED STATES PATENT AND TRADEMARK OFFICE
CERTIFICATE OF CORRECTION

PATENT NO.       : 7,196,010 B2
APPLICATION NO.  : 10/639541
DATED            : March 27, 2007
INVENTOR(S)      : Park et al.

It is certified that error appears in the above-identified patent and that said Letters Patent is hereby corrected as shown below:

Column 12, line 46 delete "a" and insert --(a)--

Column 13, line 2 delete "poiy" and insert --poly--

Column 17, line 2 delete "poiy" and insert --poly--

Column 17, line 9 delete "a" and insert --(a)--

Signed and Sealed this

Second Day of October, 2007

JON W. DUDAS
*Director of the United States Patent and Trademark Office*